(12) United States Patent
Shinozaki

(10) Patent No.: US 11,310,355 B2
(45) Date of Patent: Apr. 19, 2022

(54) RADIO FREQUENCY MODULE AND COMMUNICATION DEVICE

(71) Applicant: Murata Manufacturing Co., Ltd., Nagaokakyo (JP)

(72) Inventor: Takayuki Shinozaki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/020,822

(22) Filed: Sep. 15, 2020

(65) Prior Publication Data
US 2021/0092209 A1 Mar. 25, 2021

(30) Foreign Application Priority Data
Sep. 20, 2019 (JP) .............................. JP2019-171728

(51) Int. Cl.
| | |
|---|---|
| *H04M 1/02* | (2006.01) |
| *H03F 3/24* | (2006.01) |
| *H03F 1/56* | (2006.01) |
| *H04B 1/00* | (2006.01) |

(52) U.S. Cl.
CPC .............. *H04M 1/026* (2013.01); *H03F 1/56* (2013.01); *H03F 3/245* (2013.01); *H04B 1/005* (2013.01); *H03F 2200/171* (2013.01); *H03F 2200/222* (2013.01); *H03F 2200/387* (2013.01); *H03F 2200/451* (2013.01)

(58) Field of Classification Search
None
See application file for complete search history.

(56) References Cited

U.S. PATENT DOCUMENTS

| | | | | | |
|---|---|---|---|---|---|
| 7,608,922 | B2* | 10/2009 | Danno | ................. | H03G 3/3036 257/691 |
| 7,855,983 | B2* | 12/2010 | Knecht | .................. | H05K 1/141 370/280 |
| 8,279,614 | B2* | 10/2012 | Horten | ................. | H05K 9/0007 361/752 |
| 2004/0067771 | A1* | 4/2004 | Wieck | ..................... | G06F 1/182 455/558 |
| 2006/0189286 | A1* | 8/2006 | Kyu | ......................... | H03F 3/72 455/144 |
| 2012/0306716 | A1* | 12/2012 | Satake | ................. | H03K 17/693 343/841 |

(Continued)

FOREIGN PATENT DOCUMENTS

JP       2011-040602 A      2/2011

*Primary Examiner* — Pablo N Tran
(74) *Attorney, Agent, or Firm* — Xsensus LLP

(57) ABSTRACT

A radio frequency module that simultaneously receives a first reception signal and a second reception signal includes: a module board including a first principal surface and a second principal surface on opposite sides of the module board; a first reception low noise amplifier that is disposed in a first semiconductor IC and amplifies the first reception signal; a second reception low noise amplifier that is disposed in a second semiconductor IC different from the first semiconductor IC and amplifies the second reception signal; and an external-connection terminal that is disposed on the second principal surface. At least one of the first semiconductor IC or the second semiconductor IC is disposed on the second principal surface.

18 Claims, 5 Drawing Sheets

(56) References Cited

U.S. PATENT DOCUMENTS

2017/0040947 A1* 2/2017 Chang .................. H03F 1/0205
2017/0201291 A1* 7/2017 Gu .................... H01L 21/76898
2019/0378790 A1* 12/2019 Bohr ................. H01L 29/41791

* cited by examiner

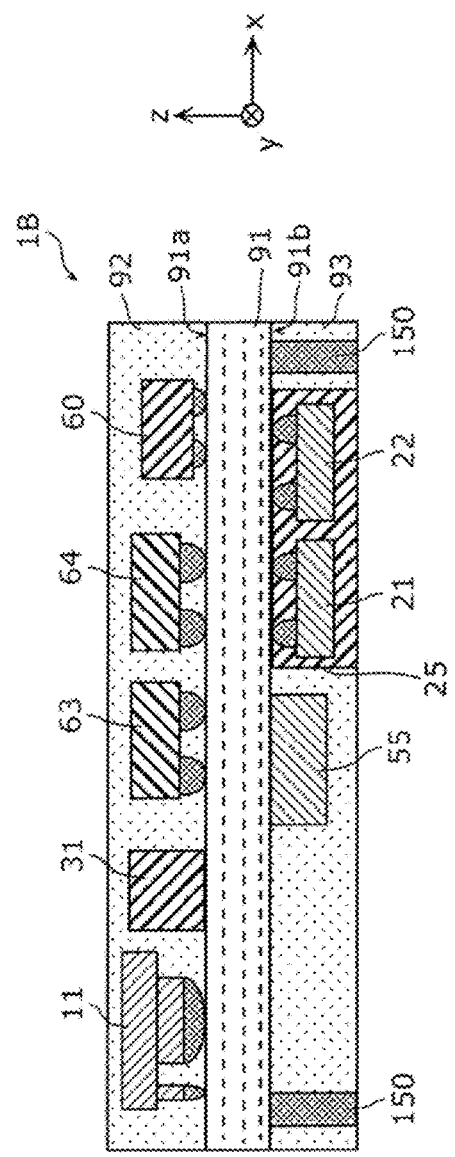

RADIO FREQUENCY MODULE AND COMMUNICATION DEVICE

CROSS REFERENCE TO RELATED APPLICATIONS

The present application is based on, and claims priority to, Japanese Patent Application No. 2019-171728 filed on Sep. 20, 2019. The entire disclosure of the above-identified application, including the specification, drawings and claims is incorporated herein by reference in its entirety.

TECHNICAL FIELD

The present disclosure relates to a radio frequency (RF) module and a communication device.

BACKGROUND

In mobile communication devices such as a mobile phone, the arrangement configuration of circuit elements included in radio frequency front-end circuits is becoming complex, particularly with developments in multiband technologies.

Japanese Unexamined Patent Application Publication No. 2011-40602 discloses a semiconductor module having a structure in which a filter is mounted on the upper surface of a wiring board capable of serving as a double-sided mounting board and a transmission power amplifier and a reception low noise amplifier are mounted on the lower surface of the wiring board. The transmission power amplifier and the reception low noise amplifier each include a semiconductor chip.

SUMMARY

Technical Problems

However, as recognized by the present inventor, with the semiconductor module disclosed in Japanese Unexamined Patent Application Publication No. 2011-40602, when a simultaneous reception is to be performed using a plurality of communication bands, it is necessary to ensure isolation between reception paths that receive radio frequency signals of different communication bands. When the isolation between the receiving paths is reduced, there arises a problem that reception sensitivity in each communication band is decreased.

In view of the above-described circumstances, the present disclosure is presented to provide a radio frequency module in which deterioration of reception sensitivity is reduced when radio frequency signals in a plurality of communication bands are simultaneously received, and a communication device including the radio frequency module.

Solutions

A radio frequency module simultaneously receives a first reception signal and a second reception signal includes: a module board including a first principal surface and a second principal surface on opposite sides of the module board; a first reception low noise amplifier that is disposed in a first semiconductor IC and amplifies the first reception signal; a second reception low noise amplifier that is disposed in a second semiconductor IC different from the first semiconductor IC and amplifies the second reception signal; and an external-connection terminal that is disposed on the second principal surface. At least one of the first semiconductor IC or the second semiconductor IC is disposed on the second principal surface.

Advantageous Effects

According to the present disclosure, it is possible to provide a radio frequency module and a communication device in which the deterioration of reception sensitivity is reduced when radio frequency signals of a plurality of communication bands are simultaneously received.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 3B is a schematic diagram illustrating a cross-sectional configuration of the radio frequency module according to Working Example 2.

DESCRIPTION OF EMBODIMENTS

Figure 1:
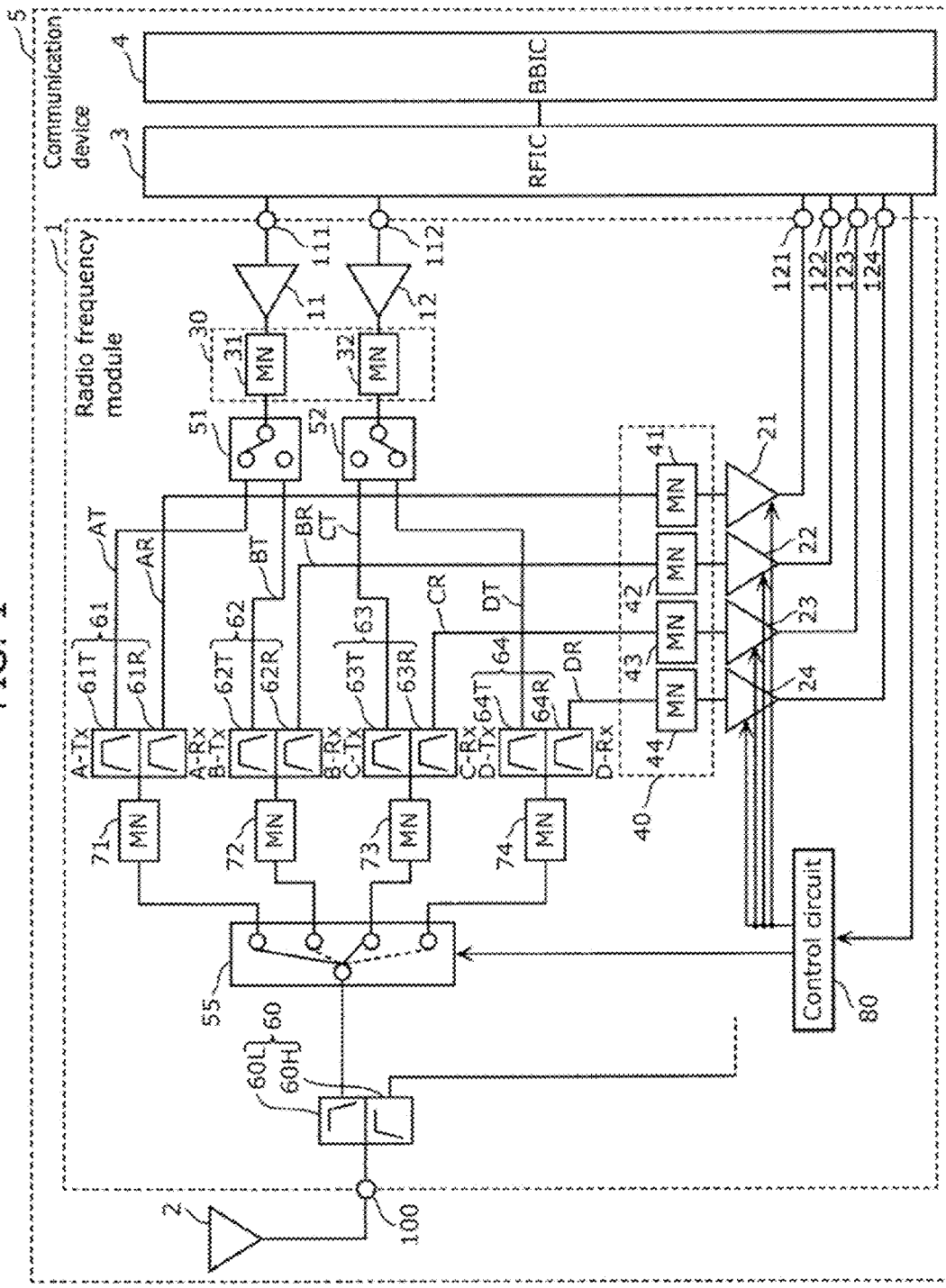
FIG. 1 illustrates a circuit configuration of a radio frequency module (or RF front-end circuitry) according to an embodiment.

The following describes in detail embodiments of the present disclosure. It should be noted that the embodiment described below illustrates a general or specific example. The numerical values, shapes, materials, structural components, the arrangement and connection of the structural components, and so on, illustrated in the following embodiment are mere examples, and therefore do not limit the present disclosure. Among the structural components in the following working examples and variations, structural components not recited in the independent claims are described as arbitrary structural components. In addition, the sizes of structural components and the ratios of the sizes in the drawings are not necessarily strictly illustrated. In each of the diagrams, the substantially same components are denoted by the same reference numerals, and overlapping description may be omitted or simplified.

In addition, in the following, terms indicating a relationship between components such as parallel and vertical and terms indicating a shape of a component such as a rectangular shape, and a numerical range do not represent only a strict meaning but include also a substantially equivalent range, such as a difference of approximately several percent.

In addition, in the following, in an example of A, B, and C being mounted on a board, "in a plan view of the board (or the principal surface of the board), C is disposed between A and B" means that a straight line connecting an arbitrary point in A and an arbitrary point in B passes through a region in C in a plan view of the board. Furthermore, a plan view of the board means that the board and circuit elements mounted on the board are orthographically projected on a plane parallel to the board.

In addition, in the following, a "transmission path" is a transfer path including a line along which a radio frequency transmission signal propagates, an electrode directly connected to the line, and a terminal directly connected to the line or the electrode, etc. Furthermore, a "reception path" is a transfer path including a line along which a radio frequency reception signal propagates, an electrode directly connected to the line, and a terminal directly connected to the line or the electrode, etc. Furthermore, a "signal path" is a transfer path including a line along which a radio frequency signal propagates, an electrode directly connected to the line, and a terminal directly connected to the line or the electrode, etc. Furthermore, as used herein the terms "circuit" or "circuitry" means one or more circuits, including discrete circuit(s) as well as circuit board(s) and combinations thereof.

Embodiment (1. Circuit Configuration of Radio Frequency Module 1 and Communication Device 5)

FIG. 1 illustrates a circuit configuration of radio frequency module 1 according to Embodiment 1. As illustrated in FIG. 1, communication device 5 includes radio frequency module 1, antenna 2, RF signal processing circuit (i.e., RFIC) 3, and baseband signal processing circuit (i.e., BBIC) 4. In this exemplary configuration the communication device is a multi-band transceiver. As used in this specification the term "module", as used with "radio frequency module", or "RF front-end module" should be construed as circuitry (programmable, as well as discrete) and associated circuit components, such as circuit boards, RF shielding, etc.

RFIC 3 is an RF signal processing circuit that processes a radio frequency signal to be transmitted by antenna 2 or processes a radio frequency signal received by antenna 2. More specifically, RFIC 3 performs signal processing, by down-conversion or the like, on a reception signal input via the reception path of radio frequency module 1, and outputs the reception signal generated by the signal processing to BBIC 4. In addition, RFIC 3 performs signal processing, by up-conversion or the like, on a transmission signal input from BBIC 4, and outputs the transmission signal generated by the signal processing to the transmission path of radio frequency module 1.

BBIC 4 is a circuit that performs signal processing using an intermediate frequency band having a lower frequency than a frequency band of a radio frequency signal that is transferred through radio frequency module 1. The signal processed by BBIC 4 is, for example, used as an image signal for image display or as a sound signal for telephone conversation via a speaker.

RFIC 3 also has a function as a controller that controls the connection of switches 51, 52, and 55 included in radio frequency module 1, based on a communication band (frequency band) used. More specifically, RFIC 3 controllably switches connection(s) between switches 51 to 55 included in radio frequency module 1, by a control signal (not illustrated). It should be noted that the controller may be disposed outside RFIC 3, and may be disposed, for example, in radio frequency module 1 or BBIC 4.

In addition, RFIC 3 functions as a controller that controls the gain, etc. of reception low noise amplifiers (LNAs) 21 to 24 included in radio frequency module 1. More specifically, RFIC 3 outputs a digital control signal such as a mobile industry processor interface (MIPI) signal, a general-purpose input/output (GPIO) signal, etc. to a control signal terminal of radio frequency module 1. In addition, RFIC 3 outputs a DC voltage signal VDC for power supply voltage Vcc and bias voltage Vbias supplied to reception low noise amplifiers 21 to 24, to the control signal terminal of radio frequency module 1. Control circuit 80 of radio frequency module 1 adjusts the gain, etc. of reception low noise amplifiers 21 to 24, by the digital control signal and the DC voltage signal that have been input via the control signal terminal. It should be noted that the controller may be provided outside RFIC 3, and may be provided, for example, in BBIC 4. Moreover, in one example the controller is a remote computer, or a distributed computer system that communicates with the radio frequency module 1 via a wireless or wired connection. Likewise, in another example, the controller is a local controller with a user interface that converts input signals into control commands that control the communication device 5 as well as subcomponents, such as the RF module 1.

Antenna 2 is connected to antenna connection terminal 100 of radio frequency module 1, emits a radio frequency signal that has been output from radio frequency module 1, receives a radio frequency signal from the outside, and outputs the radio frequency signal to radio frequency module 1.

It should be noted that, in communication device 5 according to the present embodiment, antenna 2 and BBIC 4 are not indispensable components, and thus communication device 5 may include interface ports to receive antenna 2 and an BBIC 4 as auxiliary components.

Next, a detailed configuration of radio frequency module 1 will be described.

As illustrated in FIG. 1, radio frequency module 1 includes antenna connection terminal 100, transmission power amplifiers 11 and 12, reception low noise amplifiers 21, 22, 23 and 24, transmission filters 61T, 62T, 63T and 64T, reception filters 61R, 62R, 63R and 64R, transmission output matching circuit 30, reception input matching circuit 40, matching circuits 71, 72, 73 and 74, switches 51, 52 and 55, diplexer 60, and control circuit 80.

Antenna connection terminal 100 is a common antenna terminal connected to antenna 2.

Transmission power amplifier 11 is an amplifier that amplifies a first transmission signal of communication band A (a first communication band) that belongs to a first frequency band group and a third transmission signal of communication band B (a third communication band) that belongs to the first frequency band group. The first transmission signal and the third transmission signal are input from transmission input terminal 111. In addition, transmission power amplifier 12 is an amplifier that amplifies a second transmission signal of communication band C (a second communication band) that belongs to a second frequency band group that is different from the first frequency band group and a fourth transmission signal of communication band D (a fourth communication band) that belongs to the second frequency band group. The second transmission signal and the fourth transmission signal are input from transmission input terminal 112.

Reception low noise amplifier 21 is an amplifier that amplifies a first reception signal of communication band A (the first communication band) with low noise and outputs the amplified signal to reception output terminal 121. Reception low noise amplifier 22 is an amplifier that amplifies a third reception signal of communication band B (the third communication band) with low noise and outputs the amplified signal to reception output terminal 122. Reception low noise amplifier 23 is an amplifier that amplifies a second reception signal of communication band C (the second communication band) with low noise and outputs the amplified signal to reception output terminal 123. Reception low noise amplifier 24 is an amplifier that amplifies a fourth reception signal of communication band D (the fourth communication band) with low noise and outputs the amplified signal to reception output terminal 124.

Reception low noise amplifiers 21 and 22 are disposed in a first semiconductor integrated circuit (IC) 25. In other words, reception low noise amplifiers 21 and 22 are included in one semiconductor chip. Reception low noise amplifiers 23 and 24 are disposed in second semiconductor IC 26. In other words, reception low noise amplifiers 23 and 24 are included in one semiconductor chip.

First semiconductor IC 25 and second semiconductor IC 26 each include, for example, a complementary metal oxide semiconductor (CMOS). More specifically, first semiconductor IC 25 and second semiconductor IC 26 are each formed by a silicon on insulator (SOI) process. This allows manufacturing the semiconductor ICs at low cost. It should be noted that each of first semiconductor IC 25 and second semiconductor IC 26 may include at least one of GaAs, SiGe, or GaN. With this, it is possible to output a radio frequency signal having a high-quality amplification performance and noise performance.

Reception low noise amplifier 21 and reception low noise amplifier 22 may be disposed in different semiconductor ICs. Reception low noise amplifier 23 and reception low noise amplifier 24 may be disposed in different semiconductor ICs.

Control circuit 80 adjusts the gain, etc. of reception low noise amplifiers 21 to 24 by digital control signals MIPI and GPIO and a DC voltage signal that have been input via the control signal terminal. Control circuit 80 may be disposed in first semiconductor IC 25 or second semiconductor IC 26.

Transmission filter 61T is one example of a first transmission filter, is disposed on transmission path AT connecting transmission power amplifier 11 and antenna connection terminal 100, and passes a transmission signal in a transmission band of communication band A, among the transmission signals that have been amplified by transmission power amplifier 11. Transmission filter 62T is one example of a third transmission filter, is disposed on transmission path BT connecting transmission power amplifier 11 and antenna connection terminal 100, and passes a transmission signal in a transmission band of communication band B, among the transmission signals that have been amplified by transmission power amplifier 11. Transmission filter 63T is one example of a second transmission filter, is disposed on transmission path CT connecting transmission power amplifier 12 and antenna connection terminal 100, and passes a transmission signal in a transmission band of communication band C, among the transmission signals that have been amplified by transmission power amplifier 12. Transmission filter 64T is one example of a fourth transmission filter, is disposed on transmission path DT connecting transmission power amplifier 12 and antenna connection terminal 100, and passes a transmission signal in a transmission band of communication band D, among the transmission signals that have been amplified by transmission power amplifier 12.

Reception filter 61R is one example of a first reception filter, is disposed on reception path AR connecting reception low noise amplifier 21 and antenna connection terminal 100, and passes a reception signal in a reception band of communication band A, among the reception signals that have been input from antenna connection terminal 100. Reception filter 62R is one example of a third reception filter, is disposed on reception path BR connecting reception low noise amplifier 22 and antenna connection terminal 100, and passes a reception signal in a reception band of communication band B, among the reception signals that have been input from antenna connection terminal 100. Reception filter 63R is one example of a second reception filter, is disposed on reception path CR connecting reception low noise amplifier 23 and antenna connection terminal 100, and passes a reception signal in a reception band of communication band C, among the reception signals that have been input from antenna connection terminal 100. Reception filter 64R is one example of a fourth reception filter, is disposed on reception path DR connecting reception low noise amplifier 24 and antenna connection terminal 100, and passes a reception signal in a reception band of communication band D, among the reception signals that have been input from antenna connection terminal 100.

Duplexer 61 is one example of a first duplexer, and includes transmission filter 61T and reception filter 61R. Duplexer 62 is one example of a third duplexer, and includes transmission filter 62T and reception filter 62R. Duplexer 63 is one example of a second duplexer, and includes transmission filter 63T and reception filter 63R. Duplexer 64 is one example of a fourth duplexer, and includes transmission filter 64T and reception filter 64R.

Transmission path AT transfers a transmission signal of communication band A. Transmission path AT has one end connected to an output terminal of transmission power amplifier 11, and the other end connected to antenna connection terminal 100. Transmission path BT transfers a transmission signal of communication band B. Transmission path BT has one end connected to an output terminal of transmission power amplifier 11, and the other end connected to antenna connection terminal 100. Transmission path CT transfers a transmission signal of communication band C. Transmission path CT has one end connected to an output terminal of transmission power amplifier 12, and the other end connected to antenna connection terminal 100. Transmission path DT transfers a transmission signal of communication band D. Transmission path DT has one end connected to an output terminal of transmission power amplifier 12, and the other end connected to antenna connection terminal 100.

Reception path AR transfers a reception signal of communication band A. Reception path AR has one end connected to antenna connection terminal 100, and the other end connected to an input terminal of reception low noise amplifier 21. Reception path BR transfers a reception signal of communication band B. Reception path BR has one end connected to antenna connection terminal 100, and the other end connected to an input terminal of reception low noise amplifier 22. Reception path CR transfers a reception signal of communication band C. Reception path CR has one end connected to antenna connection terminal 100, and the other end connected to an input terminal of reception low noise amplifier 23. Reception path DR transfers a reception signal of communication band D. Reception path DR has one end connected to antenna connection terminal 100, and the other end connected to an input terminal of reception low noise amplifier 24.

Transmission output matching circuit 30 includes matching circuits 31 and 32. Matching circuit 31 is disposed on a transmission path connecting transmission power amplifier 11 and transmission filters 61T and 62T, and matches the impedance of transmission power amplifier 11 with the impedance of transmission filters 61T and 62T. Matching circuit 32 is disposed on a transmission path connecting transmission power amplifier 12 and transmission filters 63T and 64T, and matches the impedance of transmission power amplifier 12 with the impedance of transmission filters 63T and 64T.

Reception input matching circuit 40 includes matching circuits 41, 42, 43, and 44. Matching circuit 41 is disposed on reception path AR connecting reception low noise amplifier 21 and reception filter 61R, and matches the impedance of reception low noise amplifier 21 with the impedance of reception filter 61R. Matching circuit 42 is disposed on reception path BR connecting reception low noise amplifier 22 and reception filter 62R, and matches the impedance of reception low noise amplifier 22 with the impedance of reception filter 62R. Matching circuit 43 is disposed on reception path CR connecting reception low noise amplifier 23 and reception filter 63R, and matches the impedance of reception low noise amplifier 23 with the impedance of reception filter 63R. Matching circuit 44 is disposed on reception path DR connecting reception low noise amplifier 24 and reception filter 64R, and matches the impedance of reception low noise amplifier 24 with the impedance of reception filter 64R.

Switch 51 includes a common terminal and two selection terminals. The common terminal of switch 51 is connected to the output terminal of transmission power amplifier 11 via matching circuit 31. One of the selection terminals of switch 51 is connected to duplexer 61 disposed on transmission path AT, and the other of the selection terminals of switch 51 is connected to duplexer 62 disposed on transmission path BT. In this connection configuration, switch 51 switches between connecting the common terminal to one of the selection terminals and connecting the common terminal to the other of the selection terminals. In other words, switch 51 switches between connecting and disconnecting of transmission power amplifier 11 and duplexers 61 and 62. Switch 51 includes, for example, a single pole double throw (SPDT) switching circuit.

Switch 52 includes a common terminal and two selection terminals. The common terminal of switch 52 is connected to the output terminal of transmission power amplifier 12 via matching circuit 32. One of the selection terminals of switch 52 is connected to duplexer 63 disposed on transmission path CT, and the other of the selection terminals of switch 52 is connected to duplexer 64 disposed on transmission path DT. In this connection configuration, switch 52 switches between connecting the common terminal to one of the selection terminals and connecting the common terminal to the other of the selection terminals. In other words, switch 52 switches between connecting and disconnecting of transmission power amplifier 12 and duplexers 63 and 64. Switch 52 includes, for example, an SPDT switching circuit.

It should be noted that reception low noise amplifiers 21 and 22 may be one reception low noise amplifier capable of amplifying reception signals of the first frequency band group. In this case, a switch that switches between connecting the above-described one reception low noise amplifier and reception path AR and connecting the above-described one reception low noise amplifier and reception path BR may be disposed between the above-described one reception low noise amplifier and reception paths AR and BR.

It should be noted that reception low noise amplifiers 23 and 24 may be one reception low noise amplifier capable of amplifying reception signals of the second frequency band group. In this case, a switch that switches between connecting the above-described one reception low noise amplifier and reception path CR and connecting the above-described one reception low noise amplifier and reception path DR may be disposed between the above-described one reception low noise amplifier and reception paths CR and DR.

Switch 55 is one example of an antenna switch, is connected to antenna connection terminal 100 via diplexer 60, and switches between connecting and disconnecting of (1) antenna connection terminal 100 and duplexer 61, (2) antenna connection terminal 100 and duplexer 62, (3) antenna connection terminal 100 and duplexer 63, and (4) antenna connection terminal 100 and duplexer 64. It should be noted that switch 55 includes a multiple-connection switching circuit capable of simultaneously connecting two or more of the above-described combinations (1) to (4).

Matching circuit 71 is disposed on a path connecting switch 55 and duplexer 61, and matches the impedance of antenna 2 and switch 55 with the impedance of duplexer 61. Matching circuit 72 is disposed on a path connecting switch 55 and duplexer 62, and matches the impedance of antenna 2 and switch 55 with the impedance of duplexer 62. Matching circuit 73 is disposed on a path connecting switch 55 and duplexer 63, and matches the impedance of antenna 2 and switch 55 with the impedance of duplexer 63.

Matching circuit 74 is disposed on a path connecting switch 55 and duplexer 64, and matches the impedance of antenna 2 and switch 55 with the impedance of duplexer 64.

Diplexer 60 is one example of a multiplexer, and includes filters 60L and 60H. Filter 60L is a filter which has, as a passband, a frequency range including the first frequency band group and the second frequency band group. Filter 60H is a filter which has, as a passband, a frequency range including another frequency band group that is different from the first frequency band group and the second frequency band group. One terminal of filter 60L and one terminal of filter 60H are commonly connected to antenna connection terminal 100. Each of filters 60L and 60H is an LC filter including, for example, at least one of a chip inductor or a chip capacitor. It should be noted that, when the first frequency band group and the second frequency band group are lower than the above-described other frequency band group, filter 60L may be a low-pass filter and filter 60H may be a high-pass filter.

It should be noted that the above-described transmission filters 61T to 64T and reception filters 61R to 64R may be, for example, one of an acoustic wave filter using a surface acoustic wave (SAW), an acoustic wave filter using a bulk acoustic wave (BAW), an LC resonant filter, and a dielectric filter, but not limited to these filters.

Transmission power amplifiers 11 and 12 and reception low noise amplifiers 21 to 24 include, for example, a field-effect transistor (FET), a hetero-junction bipolar transistor (HBT), etc. which include a Si complementary metal oxide semiconductor (CMOS) or GaAs as a material.

It should be noted that matching circuits 31, 32, 41 to 44, and 71 to 74, diplexer 60, and switches 51, 52 and 55 are not indispensable component for the radio frequency module according to the present disclosure.

In the configuration of radio frequency module 1 described above, transmission power amplifier 11, matching circuit 31, switch 51, transmission filter 61T, matching circuit 71, switch 55, and filter 60L are included in a first transmission circuit that transfers a transmission signal of communication band A toward antenna connection terminal 100. In addition, filter 60L, switch 55, matching circuit 71, reception filter 61R, matching circuit 41, and reception low noise amplifier 21 are included in a first reception circuit that transfers a reception signal of communication band A from antenna 2 via antenna connection terminal 100.

In addition, transmission power amplifier 11, matching circuit 31, switch 51, transmission filter 62T, matching circuit 72, switch 55, and filter 60L are included in a third transmission circuit that transfers a transmission signal of communication band B toward antenna connection terminal 100. In addition, filter 60L, switch 55, matching circuit 72, reception filter 62R, matching circuit 41, and reception low noise amplifier 22 are included in a third reception circuit that transfers a reception signal of communication band B from antenna 2 via antenna connection terminal 100.

In addition, transmission power amplifier 12, matching circuit 32, switch 52, transmission filter 63T, matching circuit 73, switch 55, and filter 60L are included in a second transmission circuit that transfers a transmission signal of communication band C toward antenna connection terminal 100. In addition, filter 60L, switch 55, matching circuit 73, reception filter 63R, matching circuit 42, and reception low noise amplifier 23 are included in a second reception circuit that transfers a reception signal of communication band C from antenna 2 via antenna connection terminal 100.

In addition, transmission power amplifier 12, matching circuit 32, switch 52, transmission filter 64T, matching circuit 74, switch 55, and filter 60L are included in a fourth transmission circuit that transfers a transmission signal of communication band D toward antenna connection terminal 100. In addition, filter 60L, switch 55, matching circuit 74, reception filter 64R, matching circuit 42, and reception low noise amplifier 24 are included in a fourth reception circuit that transfers a reception signal of communication band D from antenna 2 via antenna connection terminal 100.

According to the above-described circuit configuration, radio frequency module 1 is capable of simultaneously receiving: a reception signal of one of communication band A and communication band B; and a reception signal of one of communication band C and communication band D.

In addition, radio frequency module 1 does not simultaneously receive the first reception signal of communication band A and the third reception signal of communication band B. In addition, radio frequency module 1 does not synchronously receive the second reception signal of communication band C and the fourth reception signal of communication band D.

It should be noted that, the radio frequency module according to the present disclosure may be implemented without connecting the above-described four transmission circuits and the above-described four reception circuits to antenna connection terminal 100 via switch 55, and the above-described four transmission circuits and the above-described four reception circuits may be connected to antenna 2 via different terminals. Furthermore, it is sufficient if the radio frequency module according to the present disclosure includes at least the first reception circuit and the second reception circuit.

In addition, in the radio frequency module according to the present disclosure, it is sufficient if the first reception circuit includes at least reception low noise amplifier 21. In addition, it is sufficient if the second reception circuit includes at least reception low noise amplifier 23.

Here, when the circuit elements included in radio frequency module 1 described above are configured as a single module as a small-sized front-end circuit, for example, the first to fourth transmission circuits and the first to fourth reception circuits need to be located in proximity to one another. In this case, the first reception signal of communication band A and the second reception signal of communication band C which are simultaneously received interfere with each other, and thus the isolation between the reception signals which are simultaneously received is deteriorated. When the isolation between the above-described reception signals is deteriorated, there arises a problem that the reception sensitivity in communication bands A and C is decreased.

In contrast, radio frequency module 1 according to the present embodiment has a configuration that reduces electric field coupling, magnetic field coupling, or electromagnetic field coupling between the first reception circuit and the second reception circuit. The following describes the configuration of radio frequency module 1 according to the present embodiment that reduces the above-described electric field coupling, the magnetic field coupling, or the electromagnetic field coupling.

[2. Arrangement Configuration of Circuit Elements of Radio Frequency Module 1A According to Working Example 1]

Figure 2A:
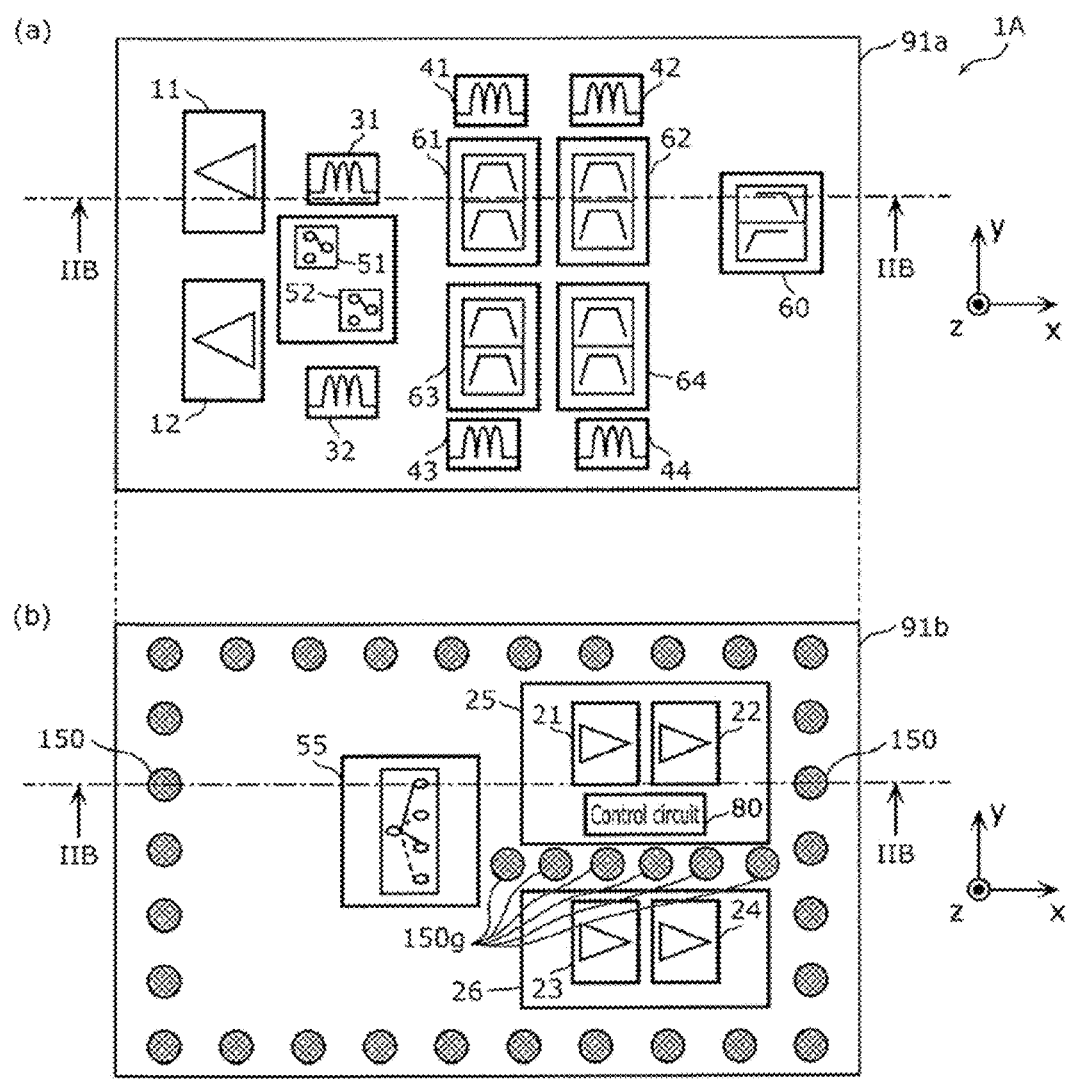
FIG. 2A is a schematic diagram illustrating a plan view configuration of a radio frequency module according to a Working Example 1.
Figure 2B:
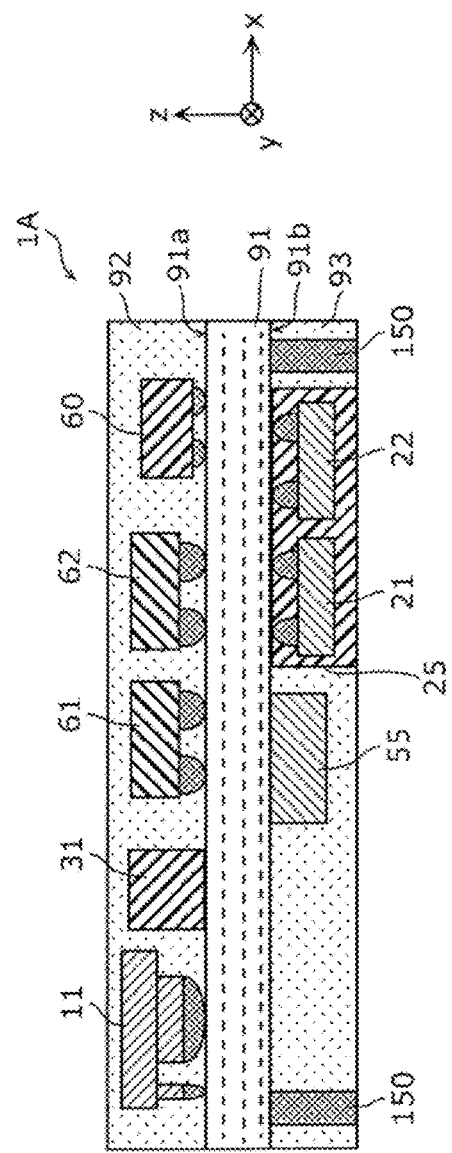
FIG. 2B is a schematic diagram illustrating a cross-sectional configuration of the radio frequency module according to Working Example 1.

FIG. 2A is a schematic diagram illustrating a plan view configuration of radio frequency module 1A according to Working Example 1. FIG. 2B is a schematic diagram illustrating a cross-sectional configuration of radio frequency module 1A according to Working Example 1. More specifically, FIG. 2B is a cross-sectional view taken along line IIB-IIB of FIG. 2A. It should be noted that (a) in FIG. 2A illustrates a layout of the circuit elements when, of principal surfaces 91a and 91b on opposite sides of module board 91, principal surface 91a is viewed from the z-axis positive side. In addition, (b) in FIG. 2A illustrates a perspective view of the layout of the circuit elements when principal surface 91b is viewed from the z-axis positive side.

in radio frequency module 1A according to Working Example 1, the arrangement configuration of the respective circuit elements included in radio frequency module 1 according to Embodiment 1 is specifically illustrated.

As illustrated in FIG. 2A and FIG. 2B, radio frequency module 1A according to the present working example includes module board 91 and resin components 92 and 93 in addition to the circuit configuration illustrated in FIG. 1.

Module board 91 is a board which includes principal surface 91a (a first principal surface) and principal surface 91b (a second principal surface) on opposite sides thereof, and on which the above-described transmission circuit and the above-described reception circuit are mounted. As module board 91, for example, a low temperature co-fired ceramic (LTCC) board having a stacked structure including a plurality of dielectric layers, a high temperature co-fired ceramic (HTCC) board, a component built-in board, a board including a redistribution layer (RDL), or a printed board or the like is used.

Resin component 92 is disposed on principal surface 91a of module board 91 and covers a portion of the above-described transmission circuit, a portion of the above-described reception circuit, and principal surface 91a of module board 91. Resin component 92 has a function of ensuring reliability such as mechanical strength and moisture resistance of the circuit elements included in the above-described transmission circuit and the above-described reception circuit. Resin component 93 is disposed on principal surface 91b of module board 91 and covers a portion of the above-described transmission circuit, a portion of the above-described reception circuit, and principal surface 91b of module board 91. Resin component 93 has a function of ensuring reliability such as mechanical strength and moisture resistance of the circuit elements included in the above-described transmission circuit and the above-described reception circuit. It should be noted that resin components 92 and 93 are not indispensable components for the radio frequency module according to the present disclosure.

As illustrated in FIG. 2A and FIG. 2B, in radio frequency module 1A according to the present working example, reception low noise amplifiers 21 and 22 and control circuit 80 are disposed in first semiconductor IC 25. Reception low noise amplifiers 23 and 24 are disposed in second semiconductor IC 26. First semiconductor IC 25 and second semiconductor IC 26 are disposed on principal surface 91b. In addition, a plurality of external-connection terminals 150 are disposed on principal surface 91b of module board 91. Radio frequency module 1A exchanges electrical signals with a motherboard disposed on the z-axis negative side of radio frequency module 1A, via the plurality of external-connection terminals 150. It should be noted that external-connection terminal 150 may be a columnar electrode that penetrates through resin component 93 in the z-axis direction as illustrated in FIG. 2A and FIG. 2B, or a bump electrode formed on principal surface 91b.

According to the above-described configuration, reception low noise amplifier 21 that amplifies a reception signal of communication band A and reception low noise amplifier 23 that amplifies a reception signal of communication band C are disposed in different semiconductor ICs. In addition, reception low noise amplifier 22 that amplifies a reception signal of communication band B and reception low noise amplifier 24 that amplifies a reception signal of communication band D are disposed in different semiconductor ICs. In other words, two reception low noise amplifiers that amplify two reception signals that are simultaneously received are disposed in different semiconductor ICs. This allows reducing electric field coupling, magnetic field coupling, or electromagnetic field coupling between the above-described two reception low noise amplifiers, and thus it is possible to improve the isolation, and suppress electromagnetic interference (EMI), between two reception signals that are simultaneously received. As a result, it is possible to reduce the deterioration of reception sensitivity in each of communication bands A to D. In addition, since reception low noise amplifiers 21 to 24 which are easy to reduce the height are arranged on principal surface 91b facing the motherboard, it is possible to reduce the height of the entire radio frequency module 1A. In addition, since a plurality of external-connection terminals 150 applied as ground electrodes can be arranged in the vicinity of reception low noise amplifiers 21 to 24 that significantly affect the reception sensitivity, it is possible to reduce deterioration of reception sensitivity.

In addition, in radio frequency module 1A according to the present working example, reception low noise amplifiers 21 and 22 are disposed in the same first semiconductor IC 25. Reception low noise amplifiers 21 and 22 respectively amplify a reception signal of communication band A and a reception signal of communication band B which are not simultaneously received. In addition, reception low noise amplifiers 23 and 24 are disposed in the same second semiconductor IC 26. Reception low noise amplifiers 23 and 24 respectively amplify a reception signal of communication band C and a reception signal of communication band D which are not simultaneously received.

According to this configuration, it is possible to reduce the layout area for mounting on the surface of module board 91 by disposing two reception low noise amplifiers that amplify two reception signals which do not require consideration for isolation in the same semiconductor IC, and thus radio frequency module 1A can be downsized.

In radio frequency module 1A according to the present working example, control circuit 80 is disposed in first semiconductor IC 25. In a plan view of module board 91, external-connection terminals 150g each having a ground potential are disposed between first semiconductor IC 25 and second semiconductor IC 26.

According to this configuration, it is possible to inhibit the digital control signal input to or output from control circuit 80 from flowing into reception low noise amplifiers 23 and 24 as digital noise. As a result, it is possible to reduce the deterioration of reception sensitivity in communication bands C and D.

It should be noted that, in radio frequency module 1A according to the present working example, transmission power amplifiers 11 and 12, duplexers 61 to 64, switches 51 and 52, matching circuits 31, 32, 41 to 44, and diplexer 60 are surface-mounted on principal surface 91a, and first semiconductor IC 25, second semiconductor IC 26, and switch 55 are surface-mounted on principal surface 91b. However, the present disclosure is not limited to this example. Transmission power amplifiers 11 and 12, duplexers 61 to 64, switches 51, 52 and 55, matching circuits 31, 32, 41 to 44, and diplexer 60 may be arranged on any of principal surfaces 91a and 91b. In addition, although not illustrated in FIG. 2A or FIG. 2B, matching circuits 71 to 74 may be surface-mounted on any of principal surfaces 91a and 91b of module board 91, or may be built-in in module board 91.

As illustrated in radio frequency module 1A according to the present working example, it is desirable that transmission power amplifiers 11 and 12 be mounted on principal surface 91a.

Transmission power amplifiers 11 and 12 are components that generate a large amount of heat among the circuit components included in radio frequency module 1A. In order to improve the heat dissipation property of radio frequency module 1A, it is important to dissipate heat generated by transmission power amplifiers 11 and 12 to the motherboard through a heat dissipation path having a small thermal resistance. If transmission power amplifiers 11 and 12 are mounted on principal surface 91b, the electrode lines connected to transmission power amplifiers 11 and 12 are arranged on principal surface 91b. For that reason, as the heat dissipation path, a heat dissipation path that passes though only a planar line pattern (along the xy plane direction) on principal surface 91b is included. The above-described planar line pattern is formed using a metal thin film, and thus has a large thermal resistance. For that reason, when transmission power amplifiers 11 and 12 are disposed on principal surface 91b, the heat dissipation property is decreased.

In contrast, when transmission power amplifiers 11 and 12 are mounted on principal surface 91a, it is possible to connect transmission power amplifiers 11 and 12 to external-connection terminals 150 through penetrating electrodes that penetrate through module board 91 between principal surface 91a and principal surface 91b. As a result, it is possible to exclude a heat dissipation path that passes through only the planar line pattern along the xy plane direction which has a large thermal resistance, from among the lines in module board 91 as the heat dissipation paths for transmission power amplifiers 11 and 12. It is thus possible to provide radio frequency module 1A which is small-sized and has an improved heat dissipation property to dissipate heat from transmission power amplifiers 11 and 12 to the motherboard.

It should be noted that control circuit 80 may be disposed in second semiconductor IC 26 instead of first semiconductor IC 25. Furthermore, control circuit 80 may be disposed in neither first semiconductor IC 25 nor second semiconductor IC 26.

In addition, it is desirable that first semiconductor IC 25, duplexers 61 and 62, and matching circuits 41 and 42 overlap in a plan view of module board 91.

As a result, it is possible to reduce the line length that connects reception low noise amplifier 21 and duplexer 61, and thus the transfer loss of reception path AR can be reduced. Furthermore, it is possible to reduce the line length that connects reception low noise amplifier 22 and duplexer 62, and thus the transfer loss of reception path BR can be reduced.

In addition, it is desirable that second semiconductor IC 26, duplexers 63 and 64, and matching circuits 43 and 44 overlap in a plan view of module board 91.

As a result, it is possible to reduce the line length that connects reception low noise amplifier 23 and duplexer 63, and thus the transfer loss of reception path CR can be reduced. Furthermore, it is possible to reduce the line length that connects reception low noise amplifier 24 and duplexer 64, and thus the transfer loss of reception path DR can be reduced.

[3. Arrangement Configuration of Circuit Elements of Radio Frequency Module 1B According to Working Example 2]

In Working Example 1, first semiconductor IC 25 and second semiconductor IC 26 are both disposed on principal surface 91*b*. However, radio frequency module 1B according to Working Example 2 has a configuration in which first semiconductor IC 25 and second semiconductor IC 26 are arranged with module board 91 being disposed therebetween.

Figure 3A:
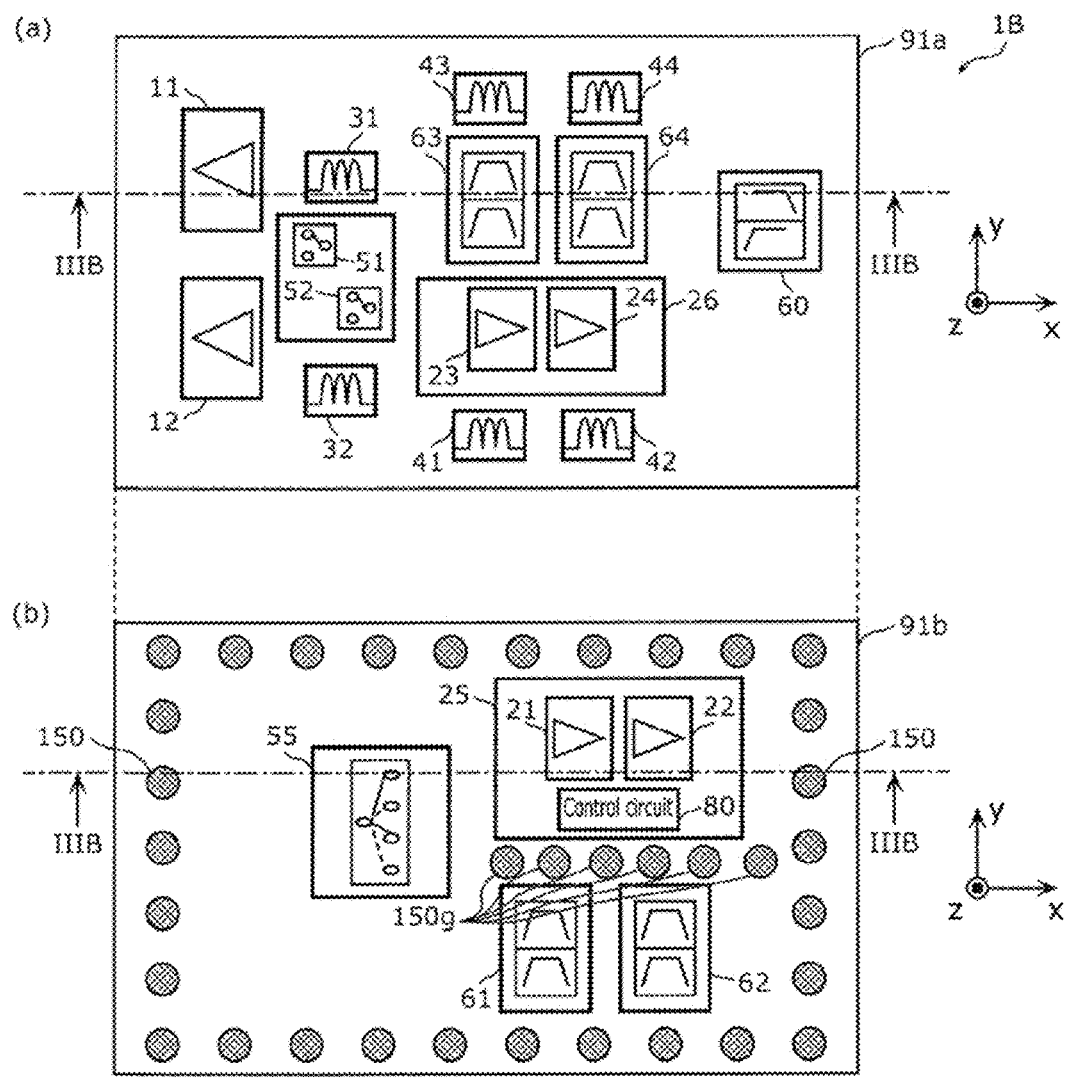
FIG. 3A is a schematic diagram illustrating a plan view configuration of the radio frequency module according to a Working Example 2.

FIG. 3A is a schematic diagram illustrating a plan view configuration of radio frequency module 1B according to Working Example 2. FIG. 3B is a schematic diagram illustrating a cross-sectional configuration of radio frequency module 1B according to Working Example 2. More specifically, FIG. 3B is a cross-sectional view taken along line IIIB-IIIB of FIG. 3A. It should be noted that (a) in FIG. 3A illustrates a layout of the circuit elements when, of principal surfaces 91*a* and 91*b* on opposite sides of module board 91, principal surface 91*a* is viewed from the z-axis positive side. In addition, (b) in FIG. 3A illustrates a perspective view of the layout of the circuit elements when principal surface 91*b* is viewed from the z-axis positive side.

Radio frequency module 1B according to Working Example 2 specifically illustrates the arrangement configuration of the respective circuit elements included in radio frequency module 1 according to Embodiment 1.

Radio frequency module 1B according to Working Example 2 is different from radio frequency module 1A according to Working Example 1 only in the arrangement configuration of the circuit elements included in radio frequency module 1B. Hereinafter, radio frequency module 1B according to the present working example will be described. In the description, the same points as those of radio frequency module 1A according to Working Example 1 will be omitted, and different points will be mainly described.

As illustrated in FIG. 3A and FIG. 3B, in radio frequency module 1B according to the present working example, reception low noise amplifiers 21 and 22 and control circuit 80 are disposed in first semiconductor IC 25. Reception low noise amplifiers 23 and 24 are disposed in second semiconductor IC 26. First semiconductor IC 25 is disposed on principal surface 91*b* and second semiconductor IC 26 is disposed on principal surface 91*a*. In addition, a plurality of external-connection terminals 150 are disposed on principal surface 91*b* of module board 91. Radio frequency module 1B exchanges electrical signals with a motherboard disposed on the z-axis negative side of radio frequency module 1B via the plurality of external-connection terminals 150.

According to the above-described configuration, reception low noise amplifier 21 that amplifies a reception signal of communication band A and reception low noise amplifier 23 that amplifies a reception signal of communication band C are disposed in different semiconductor ICs. In addition, reception low noise amplifier 22 that amplifies a reception signal of communication band B and reception low noise amplifier 24 that amplifies a reception signal of communication band D are disposed in different semiconductor ICs. In other words, two reception low noise amplifiers that amplify two reception signals that are simultaneously received are disposed in different semiconductor ICs. This allows reducing electric field coupling, magnetic field coupling, or electromagnetic field coupling between the above-described two reception low noise amplifiers, and thus it is possible to improve the isolation between two reception signals that are simultaneously received. Furthermore, in the present working example, first semiconductor IC 25 and second semiconductor IC 26 are arranged with module board 91 being disposed therebetween, and thus it is possible to further reduce electric field coupling, magnetic field coupling, or electromagnetic field coupling between the above-described two reception low noise amplifiers that amplify two reception signals simultaneously received. As a result, it is possible to further reduce the deterioration of reception sensitivity in each of communication bands A to D.

It is desirable that module board 91 have a multilayer structure in which a plurality of dielectric layers are stacked, and that at least one of the plurality of dielectric layers include a ground electrode pattern formed thereon. With this configuration, the electromagnetic field shielding function of module board 91 is further improved.

In addition, in radio frequency module 1B according to the present working example, duplexers 61 and 62 are disposed on principal surface 91*b*, and external-connection terminals 150*g* each having a ground potential are disposed between first semiconductor IC 25 and duplexers 61 and 62 in a plan view of module board 91.

According to this configuration, it is possible to inhibit the digital control signal input to or output from control circuit 80 from flowing into duplexers 61 and 62 as digital noise. As a result, it is possible to reduce the deterioration of reception sensitivity in communication bands A and B.

It should be noted that the circuit components that are disposed across external-connection terminals 150*g* from first semiconductor IC 25 on principal surface 91*b* are not limited to duplexers 61 and 62. It is sufficient if the above-described circuit component is a circuit component disposed on reception path AR connecting antenna connection terminal 100 and reception low noise amplifier 21 or on reception path BR connecting antenna connection terminal 100 and reception low noise amplifier 22. For example, the above-described circuit component may be at least one of matching circuits 41 and 42, switch 55, or diplexer 60.

It should be noted that, in radio frequency module 1B according to the present working example, second semiconductor IC 26, transmission power amplifiers 11 and 12, duplexers 63 and 64, switches 51 and 52, matching circuits 31, 32, 41 to 44, and diplexer are surface-mounted on principal surface 91*a*, and first semiconductor IC 25, duplexers 61 and 62, and switch 55 are surface-mounted on principal surface 91*b*. However, the present disclosure is not limited to this example. Transmission power amplifiers 11 and 12, duplexers 63 to 64, switches 51, 52 and 55, matching circuits 31, 32, 41 to 44, and diplexer 60 may be arranged on any of principal surfaces 91*a* and 91*b*.

[4. Advantageous Effects, Etc.]

As described above, radio frequency module 1 according to the present embodiment simultaneously receives the first reception signal and the second reception signal. Radio frequency module 1 includes module board 91 including principal surfaces 91*a* and 91*b* on opposite sides thereof, reception low noise amplifier 21 that is disposed in first semiconductor IC 25 and amplifies the first reception signal, reception low noise amplifier 23 that is disposed in second semiconductor IC 26 different from first semiconductor IC 25 and amplifies the second reception signal, and external-connection terminal 150 that is disposed on principal surface 91*b*. At least one of first semiconductor IC 25 or second semiconductor IC 26 is disposed on principal surface 91*b*.

According to this configuration, reception low noise amplifiers 21 and 23 that amplify two reception signals that are simultaneously received are disposed in different semiconductor ICs. This allows reducing electric field coupling, magnetic field coupling, or electromagnetic field coupling between reception low noise amplifiers 21 and 23, and thus it is possible to improve the isolation between two reception signals that are simultaneously received. As a result, it is possible to reduce the deterioration of reception sensitivity in communication bands A and C. In addition, it is possible to dispose external-connection terminal 150 that can be applied as a ground electrode in the vicinity of at least one of reception low noise amplifiers 21 or 23 that significantly affect the reception sensitivity. As a result, it is possible to reduce the deterioration of reception sensitivity.

In addition, radio frequency module 1 may further include reception low noise amplifier 22 disposed in first semiconductor IC 25 and configured to amplify a third reception signal. Radio frequency module 1 may be configured to not synchronously receive the first reception signal and the third reception signal.

According to this configuration, reception low noise amplifiers 21 and 22 for amplifying the first reception signal and the third reception signal that do not need consideration of isolation are disposed in the same semiconductor IC, and thus it is possible to reduce the layout area for mounting on the surface of module board 91. As a result, it is possible to downsize radio frequency module 1.

In addition, first semiconductor IC 25 and second semiconductor IC 26 may be both disposed on principal surface 91*b*.

According to this configuration, since reception low noise amplifiers 21 and 23 which are easy to reduce the height are arranged on principal surface 91*b* facing the motherboard, it is possible to reduce the height of the entire radio frequency module 1.

In addition, in a plan view of module board 91, external-connection terminal 150*g* having a ground potential may be disposed between first semiconductor IC 25 and second semiconductor IC 26.

This allows further reducing electric field coupling, magnetic field coupling, or electromagnetic field coupling between reception low noise amplifiers 21 and 23, and thus it is possible to further improve the isolation between two reception signals that are simultaneously received.

In addition, radio frequency module 1 may further include control circuit 80 disposed in first semiconductor IC 25 and configured to control reception low noise amplifier 21 by a digital control signal. In a plan view of module board 91, external-connection terminal 150*g* having a ground potential may be disposed between first semiconductor IC 25 and second semiconductor IC 26.

According to this configuration, it is possible to inhibit the digital control signal input to or output from control circuit 80 from flowing into reception low noise amplifies 23 as digital noise. As a result, it is possible to reduce the deterioration of reception sensitivity in communication band C.

In addition, first semiconductor IC 25 may be disposed on one of principal surface 91*a* and principal surface 91*b*, and second semiconductor IC 26 may be disposed on the other of principal surface 91*a* and principal surface 91*b*.

According to this configuration, first semiconductor IC 25 and second semiconductor IC 26 are arranged with module board 91 being disposed therebetween, and thus it is possible to further reduce electric field coupling, magnetic field coupling, or electromagnetic field coupling between reception low noise amplifiers 21 and 23 that amplify two reception signals simultaneously received.

In addition, radio frequency module 1 may further include: control circuit 80 disposed in first semiconductor IC 25 and configured to control reception low noise amplifier 21 by a digital control signal; antenna connection terminal 100; and a circuit component disposed on one of reception path AR and reception path CR, reception path AR connecting antenna connection terminal 100 and reception low noise amplifier 21, reception path C connecting antenna connection terminal 100 and reception low noise amplifier 23. In radio frequency module 1, first semiconductor IC 25 and the above-described circuit component may be disposed on principal surface 91*b*, second semiconductor IC 26 may be disposed on principal surface 91*a*, and in a plan view of module board 91, external-connection terminal 150*g* having a ground potential may be disposed between first semiconductor IC 25 and the above-described circuit component.

According to this configuration, it is possible to inhibit the digital control signal input to or output from control circuit 80 from flowing into the above-described circuit components as digital noise. As a result, it is possible to reduce the deterioration of reception sensitivity in communication bands A and C.

In addition, communication device 5 includes: antenna 2; RFIC 3 configured to process a radio frequency signal to be transmitted by antenna 2 and a radio frequency signal received by antenna 2; and radio frequency module 1 configured to transfer the radio frequency signals between antenna 2 and RFIC 3.

According to this configuration, it is possible to provide communication device 5 in which the deterioration of reception sensitivity is reduced when radio frequency signals of a plurality of communication bands are simultaneously received.

Other Embodiments, Etc

Although the radio frequency module and the communication device according to the embodiment of the present disclosure have been described above based on the embodiment and the working examples, the radio frequency module and the communication device according to the present disclosure are not limited to the foregoing embodiment and the working examples. The present disclosure also encompasses other embodiments achieved by combining arbitrary structural components in the above-described embodiment and the working examples, variations resulting from various modifications to the above-described embodiment and the working examples that may be conceived by those skilled in the art without departing from the essence of the present disclosure, and various devices that include the above-described radio frequency module and the above-described communication device.

For example, in the radio frequency module and the communication device according to the foregoing embodiment and the working examples thereof, another circuit element and line, for example, may be inserted in a path connecting circuit elements and a signal path which are disclosed in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable widely in communication devices such as mobile phones as a radio frequency module disposed in a multi-band compatible front end section.

The invention claimed is:

1. A radio frequency module that simultaneously receives a first reception signal and a second reception signal, the radio frequency module comprising:
   a module hoard including a first principal surface and a second principal surface on opposite sides of the module board;
   a first reception low noise amplifier disposed in a first semiconductor integrated circuit (IC) and configured to amplify the first reception signal;
   a second reception low noise amplifier disposed in a second semiconductor IC and configured to amplify the second reception signal, the second semiconductor IC being different from the first semiconductor IC;
   a transmission power amplifier disposed on the first principle surface, and
   an external-connection terminal disposed on the second principal surface, wherein
   at least one of the first semiconductor IC or the second semiconductor IC is disposed on the second principal surface,
   the first semiconductor IC is disposed on one of the first principal surface and the second principal surface, and
   the second semiconductor IC is disposed on an other of the first principal surface and the second principal surface.

2. The radio frequency module according to claim 1, wherein:
   the first reception signal is received in a first communication band, and
   the second reception signal is received in a second communication band, the first communication band being different than the second communication band.

3. The radio frequency module according to claim 1, further comprising:
   a third reception low noise amplifier disposed in the first semiconductor IC and configured to amplify a third reception signal, wherein
   the radio frequency module is configured to not simultaneously receive both the first reception signal and the third reception signal.

4. The radio frequency module according to claim 3, wherein:
   the third reception signal is received in the first communication band.

5. The radio frequency module according to claim 3, further comprising:
   a fourth reception low noise amplifier disposed in the second semiconductor IC and configured to amplify a fourth reception signal, wherein
   the radio frequency module is configured to not simultaneously receive both the second reception signal and the fourth reception signal.

6. The radio frequency module according to claim 5, wherein:
   the fourth reception signal is received in the second communication hand.

7. The radio frequency module according to claim 1, further comprising:
   a transmission power amplifier disposed on the first principle surface, wherein
   the first semiconductor IC and the second semiconductor IC are both disposed on the second principal surface.

8. The radio frequency module according to claim 3, wherein
   in a plan view of the module board, the external-connection terminal having a ground potential is disposed between the first semiconductor IC and the second semiconductor IC.

9. The radio frequency module according to claim 1, further comprising:
   a control circuit disposed in the first semiconductor IC and configured to control the first reception low noise amplifier by a digital control signal.

10. The radio frequency module according to claim 1, further comprising:
    a control circuit disposed in the first semiconductor IC and configured to control the first reception low noise amplifier by a digital control signal;
    an antenna connection terminal; and
    a circuit component disposed on one of a first reception path and a second reception path, the first reception path connecting the antenna connection terminal and the first reception low noise amplifier, the second reception path connecting the antenna connection terminal and the second reception low noise amplifier, wherein
    the first semiconductor C and the circuit component are disposed on the second principal surface, and
    the second semiconductor IC is disposed on the st principal surface.

11. The radio frequency module according to claim 10, wherein
    in a plan view of the module board, the external-connection terminal having a ground potential is disposed between the first semiconductor IC and the circuit component.

12. A communication device, comprising:
    an antenna;
    a radio frequency (RF) signal processing circuit configured to process a radio frequency signal to be transmitted by the antenna and a radio frequency signal received by the antenna; and
    a radio frequency module configured to simultaneously receive a first reception signal and a second reception signal, the radio frequency module including a module board including a first principal surface and a second principal surface on opposite sides of the module board, a first reception low noise amplifier disposed in a first semiconductor integrated circuit (IC) and configured to amplify the first reception signal, a second reception low noise amplifier disposed in a second semiconductor IC and configured to amplify the second reception signal, the second semiconductor IC being different from the first semiconductor IC, a transmission power amplifier disposed on the first principle surface, and an external-connection terminal disposed on the second principal surface, wherein at least one of the first semiconductor IC or the second semiconductor IC is disposed on the second principal surface, the first semiconductor IC is disposed on one of the first principal surface and the second principal surface, and the second semiconductor IC is disposed on an other of the first principal surface and the second principal surface.

13. The communication device according to claim 12, wherein the communication device is configured to transfer the radio frequency signals between the antenna and the RF signal processing circuit.

14. The communication device according to claim 12, wherein:

the first reception signal is received in a first communication band, and the second reception signal is received in a second communication band, the first communication band being different than the second communication band.

15. The communication device according to claim 12, wherein the radio frequency device further comprising:

a third reception low noise amplifier disposed in the first semiconductor IC and configured to amplify a third reception signal, wherein the radio frequency module is configured to not simultaneously receive both the first reception signal and the third reception signal.

16. The communication device according to claim 15, wherein:

the third reception signal is received in the first communication band.

17. The communication device according to claim 15, wherein the radio frequency device further comprising:

a fourth reception low noise amplifier disposed in the second semiconductor IC and configured to amplify a fourth reception signal, wherein the radio frequency module is configured to not simultaneously receive both the second reception signal and the fourth reception signal.

18. The communication device according to claim 17, wherein:

the fourth reception signal is received in the second communication band.

* * * * *